US012574005B2

(12) United States Patent
Daimon

(10) Patent No.: US 12,574,005 B2
(45) Date of Patent: Mar. 10, 2026

(54) ACOUSTIC WAVE DEVICE

(71) Applicant: Murata Manufacturing Co., Ltd., Nagaokakyo (JP)

(72) Inventor: Katsuya Daimon, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 812 days.

(21) Appl. No.: 17/969,730

(22) Filed: Oct. 20, 2022

(65) Prior Publication Data

US 2023/0037955 A1 Feb. 9, 2023

Related U.S. Application Data

(63) Continuation of application No. PCT/JP2021/016046, filed on Apr. 20, 2021.

(30) Foreign Application Priority Data

Apr. 27, 2020 (JP) ................................. 2020-078147

(51) Int. Cl.
*H01H 9/02* (2006.01)
*H03H 9/02* (2006.01)
(Continued)

(52) U.S. Cl.
CPC ........ *H03H 9/145* (2013.01); *H03H 9/02007* (2013.01); *H03H 9/02842* (2013.01);
(Continued)

(58) Field of Classification Search
CPC ........... H03H 9/02818; H03H 9/02559; H03H 9/02637; H03H 9/02866; H03H 9/25
(Continued)

(56) References Cited

U.S. PATENT DOCUMENTS

2008/0061657 A1* 3/2008 Matsuda .............. H03H 9/0038
333/186
2010/0277036 A1 11/2010 Shimizu et al.
(Continued)

FOREIGN PATENT DOCUMENTS

JP 2013518455 A 5/2013
JP 2014509134 A 4/2014
(Continued)

OTHER PUBLICATIONS

International Search Report in PCT/JP2021/016046, mailed Jun. 22, 2021, 6 pages.
(Continued)

*Primary Examiner* — Derek J Rosenau
(74) *Attorney, Agent, or Firm* — Keating & Bennett, LLP

(57) ABSTRACT

An acoustic wave device includes a piezoelectric substrate and an IDT electrode on the piezoelectric substrate and including electrode fingers. A portion where adjacent electrode fingers of the IDT electrode overlap each other in an acoustic wave propagation direction is an intersecting region. The intersecting region includes a central region located in a central portion in a direction in which the electrode fingers extend and first and second edge regions on both sides of the central region in the direction in which the electrode fingers extend. The acoustic wave device further includes dielectric films between the piezoelectric substrate and the electrode fingers in the first and second edge regions. The dielectric films include at least one of hafnium oxide, niobium oxide, tungsten oxide, or cerium oxide.

18 Claims, 5 Drawing Sheets

(51) Int. Cl.

| | | |
|---|---|---|
| *H03H 9/13* | (2006.01) | |
| *H03H 9/145* | (2006.01) | |
| *H03H 9/25* | (2006.01) | |

(52) U.S. Cl.
CPC ........ *H03H 9/02992* (2013.01); *H03H 9/131* (2013.01); *H03H 9/25* (2013.01)

(58) Field of Classification Search
USPC ...... 310/313 R, 313 A, 313 B, 313 C, 313 D
See application file for complete search history.

(56) References Cited

U.S. PATENT DOCUMENTS

| | | | |
|---|---|---|---|
| 2013/0051588 A1 | 2/2013 | Ruile et al. | |
| 2014/0035436 A1 | 2/2014 | Ruile et al. | |
| 2016/0336918 A1 | 11/2016 | Knauer et al. | |
| 2016/0359468 A1* | 12/2016 | Taniguchi | H03H 9/02921 |
| 2016/0380611 A1* | 12/2016 | Kai | H03H 9/02984 |
| | | | 310/313 B |
| 2017/0155373 A1 | 6/2017 | Ruby et al. | |
| 2017/0370791 A1 | 12/2017 | Nakamura et al. | |
| 2019/0158059 A1 | 5/2019 | Taniguchi | |
| 2020/0091892 A1 | 3/2020 | Watanabe et al. | |
| 2020/0091894 A1 | 3/2020 | Nakahashi | |
| 2021/0006223 A1 | 1/2021 | Daimon et al. | |
| 2021/0175872 A1* | 6/2021 | Daimon | H03H 9/568 |
| 2022/0182035 A1 | 6/2022 | Daimon et al. | |

FOREIGN PATENT DOCUMENTS

| | | | |
|---|---|---|---|
| JP | 2017503432 A | 1/2017 | |
| JP | 2018006851 A | 1/2018 | |
| JP | 2019075704 A | 5/2019 | |
| JP | 2020048067 A | 3/2020 | |
| KR | 20190018525 A | 2/2019 | |
| WO | 2009098840 A1 | 8/2009 | |
| WO | 2018216417 A1 | 11/2018 | |
| WO | 2019194140 A1 | 10/2019 | |
| WO | 2021039038 A1 | 3/2021 | |

OTHER PUBLICATIONS

Written Opinion in PCT/JP2021/016046, mailed Jun. 22, 2021, 8 pages.

* cited by examiner

ACOUSTIC WAVE DEVICE

CROSS REFERENCE TO RELATED APPLICATIONS

This application claims the benefit of priority to Japanese Patent Application No. 2020-078147 filed on Apr. 27, 2020 and is a Continuation Application of PCT Application No. PCT/JP2021/016046 filed on Apr. 20, 2021. The entire contents of each application are hereby incorporated herein by reference.

BACKGROUND OF THE INVENTION

1. Field of the Invention

The present invention relates to an acoustic wave device.

2. Description of the Related Art

Conventionally, acoustic wave devices are widely used, for example, as a filter of a mobile phone. US 2017/0155373 A1 discloses an example of an acoustic wave device. In this acoustic wave device, an Interdigital Transducer (IDT) electrode is provided on a piezoelectric layer. A plurality of dielectric films are provided between front end portions of a plurality of electrode fingers of the IDT electrode and the piezoelectric layer. SiO$_2$, Al$_2$O$_3$, PSG (phosphosilicate glass), BSG (borosilicate glass), and others are exemplified as a dielectric used for the dielectric films.

Conventionally, it is thought that in a case where an SiO$_2$ film is used as a dielectric film, an acoustic velocity is low in a region where the SiO$_2$ film is provided, and it is thought that a piston mode is thus established. However, it has been discovered as a result of studies conducted by the inventor of preferred embodiments of the present invention that in a case where an SiO$_2$ film is provided between an IDT electrode and a piezoelectric layer, an acoustic velocity becomes high. Accordingly, even in a case where an SiO$_2$ film is provided between an IDT electrode and a piezoelectric layer, a piston mode is difficult to be established, and it is difficult to suppress transverse-mode spurious.

SUMMARY OF THE INVENTION

Preferred embodiments of the present invention provide acoustic wave devices that are each able to reduce or prevent a transverse mode with more certainty.

An acoustic wave device according to a preferred embodiment of the present invention includes a piezoelectric substrate, and an interdigital transducer (IDT) electrode on the piezoelectric substrate and including a plurality of electrode fingers, wherein a portion where adjacent electrode fingers of the IDT electrode overlap each other in an acoustic wave propagation direction is an intersecting region, and the intersecting region includes a central region located at a central portion in a direction in which the plurality of electrode fingers extend and a pair of edge regions on both sides of the central region in the direction in which the plurality of electrode fingers extend, the acoustic wave device further includes a dielectric film between the piezoelectric substrate and the plurality of electrode fingers in the pair of edge regions, and the dielectric film includes at least one of hafnium oxide, niobium oxide, tungsten oxide, and cerium oxide.

An acoustic wave device according to a preferred embodiment of the present invention includes a piezoelectric substrate that includes a piezoelectric layer, and an interdigital transducer (IDT) electrode on the piezoelectric substrate and including a plurality of electrode fingers, wherein a portion where adjacent electrode fingers of the IDT electrode overlap each other in an acoustic wave propagation direction is an intersecting region, and the intersecting region includes a central region located at a central portion in a direction in which the plurality of electrode fingers extend and a pair of edge regions on both sides of the central region in the direction in which the plurality of electrode fingers extend, the acoustic wave device further includes a dielectric film between the piezoelectric substrate and the plurality of electrode fingers in the pair of edge regions, the piezoelectric layer is a lithium tantalate layer, the IDT electrode includes a main electrode layer, and the main electrode layer is an Al layer, and t_D [λ], ε, d [kg/m$^3$], Y [GPa], t_LT [λ], and t_Al [λ] are values that make Ve/Vc derived by the following formula 1 less than 1 where λ [μm] is a wavelength defined by an electrode finger pitch of the IDT electrode, t_D [λ] is a thickness of the dielectric film, ε is a dielectric constant of the dielectric film, d [kg/m$^3$] is a density of the dielectric film, Y [GPa] is a Young's modulus of the dielectric film, t_LT [λ] is a thickness of the piezoelectric layer, t_Al [λ] is a thickness of the main electrode layer of the IDT electrode, Vc is an acoustic velocity in the central region, and Ve is an acoustic velocity in the pair of edge regions.

$$
\begin{aligned}
Ve/Vc = {} & 1.00431413354797 + (- \\
& 0.00285716659280799) \times ((d[\text{kg/m3}]) - \\
& 4.66559485530547) + 0.0000854138472667538 \times \\
& ((Y[\text{GPa}]) - 163.239549839228) + (- \\
& 0.000350625383356713) \times (\varepsilon - \\
& 20.050911039657) + 0.262088599487209 \times ((t\_D \\
& [\lambda]) - 0.00998794212218652) + (- \\
& 000121829646867971) \times ((t\_LT[\lambda]) - \\
& 0.29981243301179) + (-0.0171813623903716) \times \\
& ((t\_Al[\lambda]) - 0.064995980707398) + \\
& 0.0000011344571772174 \times (((d[\text{kg/m3}]) - \\
& 4.66559485530547) \times ((Y[\text{GPa}]) - \\
& 163.239549839228)) + (- \\
& 0.0000000093865377665 1) \times (((Y[\text{GPa}]) - \\
& 163.239549839228) \times ((Y[\text{GPa}]) - \\
& 163.239549839228) - 7625.27702101924) + \\
& 0.0000162006962167552 \times ((\varepsilon - \\
& 20.050911039657) \times (\varepsilon - 20.050911039657) - \\
& 125.050998634098) + (-0.286079428865232) \times \\
& (((d[\text{kg/m3}]) - 4.66559485530547) \times ((t\_D[\lambda]) - \\
& 0.00998794212218652)) + \\
& 0.00817326864820186 \times (((Y[\text{GPa}]) - \\
& 163.239549839228) \times ((t\_D[\lambda]) - \\
& 0.00998794212218652)) + (-0.0221047213078) \times \\
& ((\varepsilon - 20.050911039657) \times ((t\_D[\lambda]) - \\
& 0.00998794212218652)) + (- \\
& 17.2441046243263) \times (((t\_D[\lambda]) - \\
& 0.00998794212218652) \times ((t\_D[\lambda]) - \\
& 0.00998794212218652) - \\
& 0.0000249563122710345) + \\
& 0.00438054956998946 \times ((((d[\text{kg/m3}]) - \\
& 4.66559485530547) \times ((t\_LT[\lambda]) - \\
& 0.29981243301179)) + (- \\
& 0.000147617022443897) \times (((Y[\text{GPa}]) - \\
& 163.239549839228) \times ((t\_LT[\lambda]) - 0, \\
& 29981243301179)) + (-0.23034817620302) \times \\
& (((t\_D[\lambda]) - 0.00998794212218652) \times ((t\_LT[\lambda]) - \\
& 0.29981243301179)) + (-0.0367578157483136) \times \\
& (((t\_LT[\lambda]) - 0.29981243301179) \times ((t\_LT[\lambda]) - \\
& 0.29981243301179) - 0.0199865671766099) + \\
& 0.000409293299970899 \times (((Y[\text{GPa}]) - \\
& 163.239549839228) \times ((t\_Al[\lambda]) - \\
& 0.064995980707398)) + (-1.89603355496479) \times \\
& (((t\_D[\lambda]) - 0.00998794212218652) \times ((t\_Al[\lambda]) - \\
& 0.064995980707398)) + (- \\
& 0.0528637488540428) \times ((((t\_LT[\lambda]) - \\
& 0.29981243301179) \times ((t\_Al[\lambda]) - \\
& 0.064995980707398))
\end{aligned}
$$

formula 1

With the acoustic wave devices according to preferred embodiments of the present invention, the transverse mode is able to be reduced or prevented with more certainty.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described below with reference to the drawings.

The preferred embodiments described herein are illustrative, and partial substitution or combination between configurations of different preferred embodiments is possible.

Figure 1:
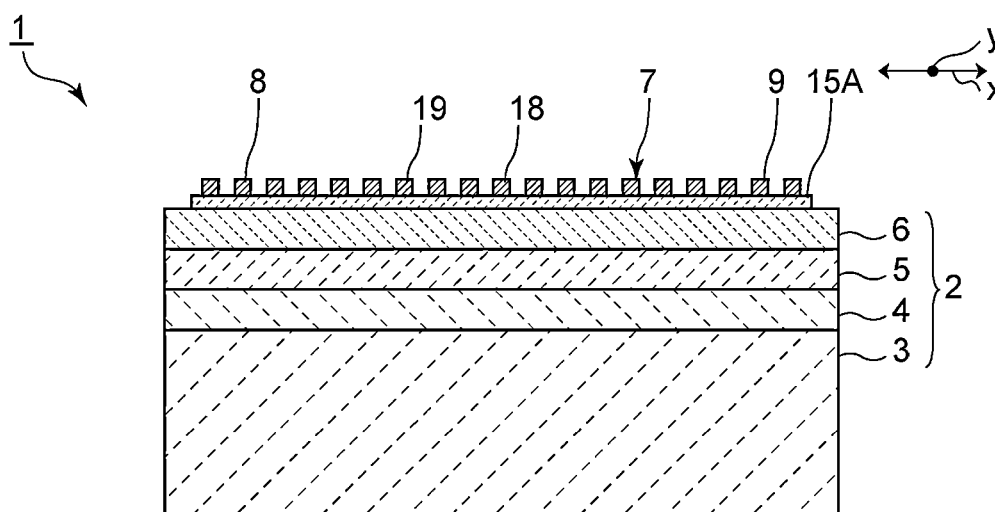
FIG. 1 is a front cross-sectional view of an acoustic wave device according to a first preferred embodiment of the present invention.

FIG. 1 is a front cross-sectional view of an acoustic wave device according to a first preferred embodiment of the present invention.

Figure 2:
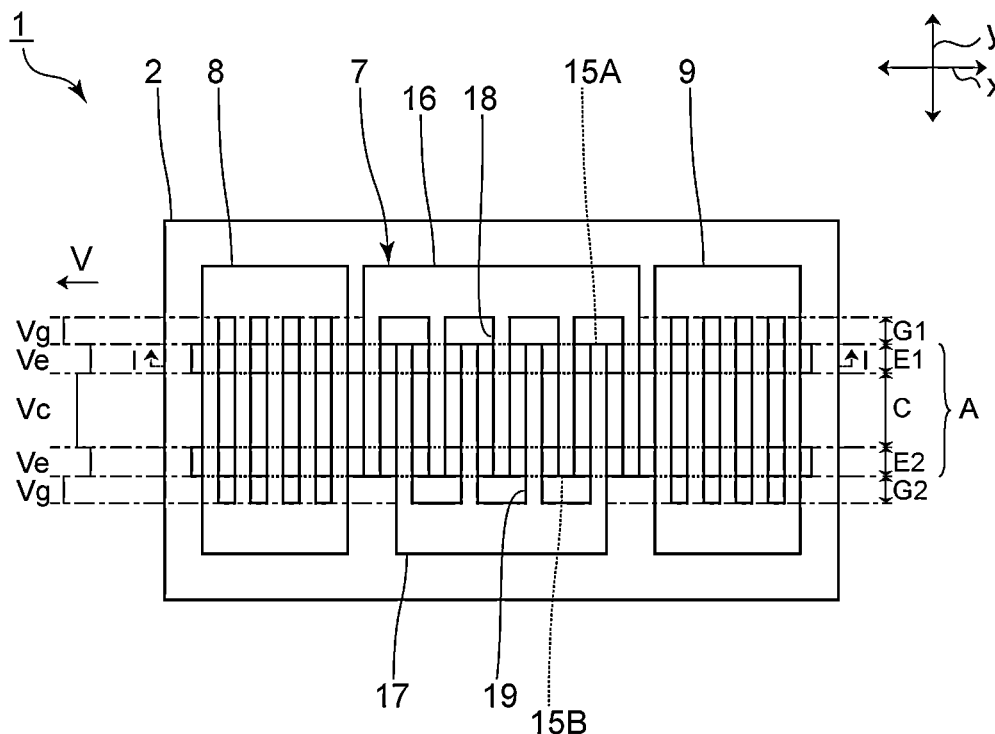
FIG. 2 is a plan view of the acoustic wave device according to the first preferred embodiment of the present invention.

FIG. 2 is a plan view of the acoustic wave device according to the first preferred embodiment. FIG. 1 is a cross-sectional view taken along line I-I in FIG. 2, which passes a first edge region, which will be described later.

In the acoustic wave device 1 illustrated in FIGS. 1 and 2, a transverse mode is reduced or prevented by establishing a piston mode. The acoustic wave device 1 includes a piezoelectric substrate 2. An IDT electrode 7 is provided on the piezoelectric substrate 2. The IDT electrode 7 includes a plurality of electrode fingers. As illustrated in FIG. 2, a dielectric film 15A and a dielectric film 15B are provided between front end portions of the plurality of electrode fingers and the piezoelectric substrate 2.

One of the unique features of the present preferred embodiment is that the dielectric film 15A and the dielectric film 15B include at least one dielectric selected from the group consisting of hafnium oxide, niobium oxide, tungsten oxide, and cerium oxide. This makes it possible to establish the piston mode with more certainty, thus making it possible to reduce or prevent the transverse mode with more certainty. Details of the advantageous effects will be described below together with details of the configuration of the present preferred embodiment.

As illustrated in FIG. 1, the piezoelectric substrate 2 includes a support substrate 3, a high-acoustic-velocity film 4 defining and functioning as a high-acoustic-velocity material layer, a low-acoustic-velocity film 5, and a piezoelectric layer 6. More specifically, the high-acoustic-velocity film 4 is provided on the support substrate 3. The low-acoustic-velocity film 5 is provided on the high-acoustic-velocity film 4. The piezoelectric layer 6 is provided on the low-acoustic-velocity film 5.

The IDT electrode 7 is provided on the piezoelectric layer 6 of the piezoelectric substrate 2. An acoustic wave is excited by applying an AC voltage to the IDT electrode 7. As illustrated in FIG. 2, a pair of reflectors 8 and 9 are provided on the piezoelectric substrate 2 on both sides of the IDT electrode 7 in an acoustic wave propagation direction. The acoustic wave device 1 is a surface acoustic wave resonator. However, an acoustic wave device according to a preferred embodiment of the present invention is not limited to an acoustic wave resonator and may be, for example, a filter device or a multiplexer having an acoustic wave resonator.

As illustrated in FIG. 2, the IDT electrode 7 includes a first busbar 16, a second busbar 17, a plurality of first electrode fingers 18, and a plurality of second electrode fingers 19. The first busbar 16 and the second busbar 17 face each other. One end of each of the plurality of first electrode fingers 18 is connected to the first busbar 16. One end of each of the plurality of second electrode fingers 19 is connected to the second busbar 17. The plurality of first electrode fingers 18 and the plurality of second electrode fingers 19 are interdigitated with each other. Hereinafter, the acoustic wave propagation direction is referred to as an x direction. A direction in which the first electrode fingers 18 and the second electrode fingers 19 extend is referred to as a first direction y. In the present preferred embodiment, the x direction and the y direction are orthogonal or substantially orthogonal to each other.

The IDT electrode 7 includes a main electrode layer and two adhesion layers. The adhesion layer, the main electrode layer, and the adhesion layer are laminated in this order from the piezoelectric layer 6 side. In the specification, the main electrode layer is a dominant electrode layer in excitation of an acoustic wave. In the present preferred embodiment, both of the two adhesion layers are, for example, Ti layers, and the main electrode layer is, for example, an Al layer. However, a material of the IDT electrode 7 is not limited to this. Alternatively, the IDT electrode 7 may include only the main electrode layer. The reflectors 8 and 9 may include the same or similar material to the IDT electrode 7.

The piezoelectric layer 6 is, for example, a lithium tantalate layer. More specifically, a piezoelectric body used for the piezoelectric layer 6 is 55° Y-cut X-propagating LiTaO$_3$. A material and cut-angles of the piezoelectric layer 6 are not limited to these.

The low-acoustic-velocity film 5 is a film of a relatively low acoustic velocity. More specifically, an acoustic velocity of a bulk wave propagating through the low-acoustic-velocity film 5 is lower than an acoustic velocity of a bulk wave propagating through the piezoelectric layer 6. The low-acoustic-velocity film 5 according to the present preferred embodiment is, for example, a silicon oxide film. Silicon oxide is represented by $SiO_a$ where a is any positive number. Silicon oxide of the low-acoustic-velocity film 5 according to the present preferred embodiment is, for example, $SiO_2$. A material of the low-acoustic-velocity film 5 is not limited to this and can be, for example, glass, silicon oxynitride, lithium oxide, tantalum pentoxide, or a material including, as a main component, a compound obtained by adding fluorine, carbon, or boron to silicon oxide.

In the present preferred embodiment, the high-acoustic-velocity material layer is the high-acoustic-velocity film 4. The high-acoustic-velocity material layer is a layer of a relatively high acoustic velocity. More specifically, an acoustic velocity of a bulk wave propagating through the high-acoustic-velocity material layer is higher than an acoustic velocity of a bulk wave propagating through the piezoelectric layer 6. In the present preferred embodiment, the high-acoustic-velocity film 4 defining and functioning as the high-acoustic-velocity material layer is, for example, a silicon nitride film. Silicon nitride of the high-acoustic-velocity film 4 according to the present preferred embodiment is, for example, SiN. However, a material of the high-acoustic-velocity film 4 is not limited to this and can be, for example, a medium including the above material as a main component, such as silicon, aluminum oxide, silicon carbide, silicon oxynitride, sapphire, lithium tantalate, lithium niobate, quartz, alumina, zirconia, cordierite, mullite, steatite, forsterite, magnesia, diamond like carbon (DLC) film, or diamond.

In the present preferred embodiment, the support substrate 3 is, for example, a silicon substrate. A material of the support substrate 3 is not limited to this and can be, for example, a piezoelectric body such as aluminum oxide, lithium tantalate, lithium niobate, or quartz, a ceramic such as alumina, sapphire, magnesia, silicon nitride, aluminum nitride, silicon carbide, zirconia, cordierite, mullite, steatite, or forsterite, a dielectric such as diamond or glass, a semiconductor such as gallium nitride, or a resin.

In the present preferred embodiment, the piezoelectric substrate 2 has a structure in which the high-acoustic-velocity film 4 defining and functioning as the high-acoustic-velocity material layer, the low-acoustic-velocity film 5, and the piezoelectric layer 6 are laminated in this order. This makes it possible to effectively trap energy of an acoustic wave on the piezoelectric layer 6 side.

As illustrated in FIG. 2, a portion of the IDT electrode 7 in which the first electrode fingers 18 and the second electrode fingers 19 overlap each other in the x direction is an intersecting region A. The intersecting region A includes a central region C, a first edge region E1, and a second edge region E2. The central region C is located on a central portion in the y direction in the intersecting region A. The first edge region E1 and the second edge region E2 are disposed on both sides of the central region C in the y direction. More specifically, the first edge region E1 is disposed on a first busbar 16 side relative to the central region C. The second edge region E2 is disposed on a second busbar 17 side relative to the central region C. Hereinafter, the first edge region E1 and the second edge region E2 are sometimes referred to simply as an edge region.

The IDT electrode 7 includes a first gap region G1 and a second gap region G2. The first gap region G1 is located between the first edge region E1 and the first busbar 16. The second gap region G2 is located between the second edge region E2 and the second busbar 17. In the first gap region G1, the second electrode fingers 19 are not provided, and only the first electrode fingers 18 are provided. Accordingly, an acoustic velocity in the first gap region G1 is higher than an acoustic velocity in the central region C. Similarly, in the second gap region G2, the first electrode fingers 18 are not provided, and only the second electrode fingers 19 are provided. Accordingly, an acoustic velocity in the second gap region G2 is higher than the acoustic velocity in the central region C. Vc is lower than Vg where Vc is the acoustic velocity in the central region C and Vg is the acoustic velocity in the first gap region G1 and the second gap region G2. In this way, a high-acoustic-velocity region is provided in the first gap region G1 and the second gap region G2.

In the first edge region E1, the single dielectric film 15A is provided between the piezoelectric substrate 2 and all of the first electrode fingers 18 and all of the second electrode fingers 19. The dielectric film 15A has, for example, a band shape. The dielectric film 15A is also provided in all portions between adjacent electrode fingers on the piezoelectric substrate 2.

Furthermore, the dielectric film 15A is also provided between the piezoelectric substrate 2 and the reflectors 8 and 9. Similarly, in the second edge region E2, the single dielectric film 15B is provided between the piezoelectric substrate 2 and all of the first electrode fingers 18 and all of the second electrode fingers 19. The dielectric film 15B has, for example, a band shape. The dielectric film 15B is also provided in all portions between adjacent electrode fingers on the piezoelectric substrate 2. Furthermore, the dielectric film 15B is also provided between the piezoelectric substrate 2 and the reflectors 8 and 9. However, the dielectric film 15A and the dielectric film 15B is not required to be provided between the piezoelectric substrate 2 and the reflectors 8 and 9.

The configuration is not limited to the configuration in which the single dielectric film 15A is provided between the piezoelectric substrate 2 and all of the electrode fingers of the IDT electrode 7. The acoustic wave device 1 may include a plurality of dielectric films 15A. The dielectric film 15A only needs to be provided between the piezoelectric substrate 2 and at least one electrode finger of the IDT electrode 7. The dielectric film 15A is not required to be provided in portions between adjacent electrode fingers on the piezoelectric substrate 2. However, in a case where a plurality of dielectric films 15A are provided, the dielectric films 15A are preferably provided between the piezoelectric substrate 2 and all of the electrode fingers.

Similarly, the acoustic wave device 1 may include a plurality of dielectric films 15B. The dielectric film 15B only needs to be provided between the piezoelectric substrate 2 and at least one electrode finger of the IDT electrode 7. The dielectric film 15B is not required to be provided in portions between adjacent electrode fingers on the piezoelectric substrate 2. However, in a case where a plurality of dielectric films 15B are provided, the dielectric films 15B are preferably provided between the piezoelectric substrate 2 and all of the electrode fingers.

In the present preferred embodiment, the dielectric film 15A and the dielectric film 15B are made of, for example, at least one dielectric selected from the group consisting of hafnium oxide, niobium oxide, tungsten oxide, and cerium oxide. This makes it possible to lower an acoustic velocity in the first edge region E1 and the second edge region E2 with more certainty. Ve can be made lower than Vc where Ve is an acoustic velocity in the first edge region E1 and the second edge region E2. In this way, a low-acoustic-velocity region can be formed in the first edge region E1 and the second edge region E2 with more certainty. Details of an effect produced by making Ve lower than Vc, that is, making Ve/Vc lower than 1 will be described below.

An acoustic wave device having the configuration of the first preferred embodiment, a first comparative example, and a reference example were compared as to behavior of change of an acoustic velocity. More specifically, comparison was made as to behavior of change of an acoustic velocity relative to change of a film thickness of a dielectric film. The acoustic velocity was calculated by measuring a resonant frequency. More specifically, a relationship V=fλ is established where V is an acoustic velocity, f is a frequency, and λ is a wavelength defined by an electrode finger pitch of an IDT electrode. The acoustic velocity was calculated from this relationship.

In the first preferred embodiment, behavior of the acoustic velocity was examined in each of a case where the dielectric film was a $HfO_2$ film, a case where the dielectric film was a $Nb_2O_5$ film, a case where the dielectric film was a $WO_3$ film, and a case where the dielectric film was a $CeO_2$ film. In the first comparative example, a dielectric used for the dielectric film is different from that in the first preferred embodiment. As the first comparative example, behavior of the acoustic velocity was examined in each of a case where the dielectric film was a $SiO_2$ film and a case where the dielectric film was a SiN film. The reference example is different from the first preferred embodiment in that the dielectric film is provided on the IDT electrode and the dielectric film is a $SiO_2$ film. The acoustic velocity was also measured in a case where no dielectric film was provided.

Design parameters of the acoustic wave device having the configuration of the first preferred embodiment and the acoustic wave devices according to the first comparative example and the reference example are as follows.

Support substrate; material . . . Si

High-acoustic-velocity film; material SiN, thickness . . . about 300 nm

Low-acoustic-velocity film; material $SiO_2$, thickness . . . 300 nm

Piezoelectric layer; material . . . 55° Y-cut X-propagating $LiTaO_3$, thickness . . . about 400 nm Layer configuration of IDT electrode; layer configuration . . . Ti layer/Al layer/Ti layer from the piezoelectric layer side, thickness . . . about 12 nm/about 100 nm/about 4 nm from the piezoelectric layer side Wavelength of IDT electrode; about 2 μm Duty ratio of IDT electrode; about 0.5

Figure 3:
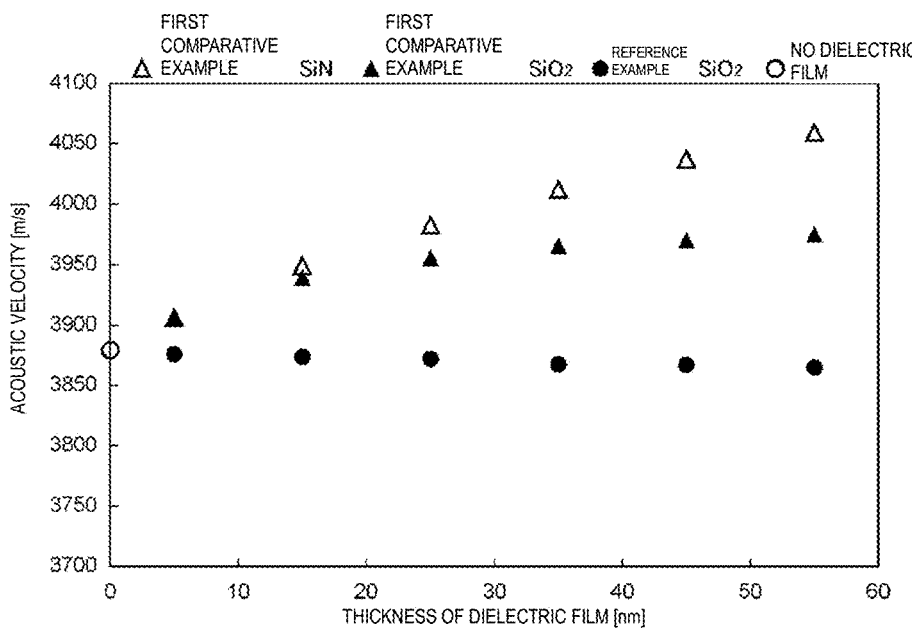
FIG. 3 illustrates a relationship between a thickness of a dielectric film and an acoustic velocity in an acoustic wave device according to a first comparative example and an acoustic wave device according to a reference example.
Figure 4:
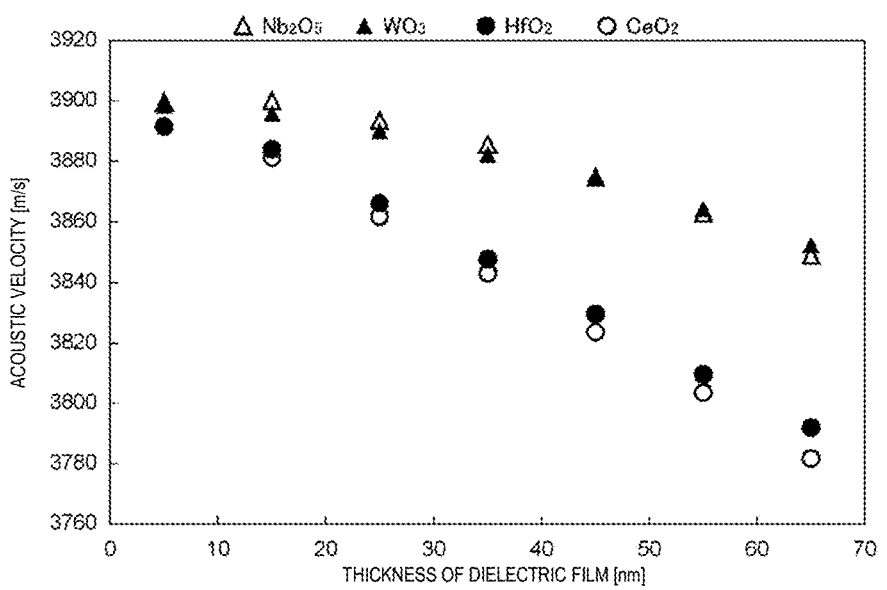
FIG. 4 illustrates a relationship between a thickness of a dielectric film and an acoustic velocity in the acoustic wave device according to the first preferred embodiment of the present invention.

Dielectric film; thickness . . . changed in increments of about 10 nm within a range from about 5 nm to about 65 nm or within a range from about 5 nm to about 55 nm FIG. 3 illustrates a relationship between the thickness of the dielectric film and the acoustic velocity in each of the acoustic wave device according to the first comparative example and the acoustic wave device according to the reference example. FIG. 4 illustrates a relationship between the thickness of the dielectric film and the acoustic velocity in the acoustic wave device according to the first preferred embodiment.

As illustrated in FIG. 3, in the first comparative example, in a case where the dielectric film is an $SiO_2$ film, the acoustic velocity is higher than in a case where no dielectric film is provided.

Furthermore, the acoustic velocity becomes higher as the dielectric film becomes thicker. Similarly, in a case where the dielectric film is an SiN film, the acoustic velocity becomes higher as the dielectric film becomes thicker. Note that in a case where the dielectric film is an $SiO_2$ film but is provided on the IDT electrode as in the reference example, the acoustic velocity becomes lower as the dielectric film becomes thicker.

On the other hand, as illustrated in FIG. 4, in the first preferred embodiment, the acoustic velocity becomes lower as the dielectric film 15A and the dielectric film 15B becomes thicker in each of a case where the dielectric film 15A and the dielectric film 15B are $HfO_2$ films, a case where the dielectric film 15A and the dielectric film 15B are $Nb_2O_5$ films, a case where the dielectric film 15A and the dielectric film 15B are $WO_3$ films, and a case where the dielectric film 15A and the dielectric film 15B are $CeO_2$ films. In this way, in the first preferred embodiment, a low-acoustic-velocity region can be formed in the first edge region E1 and the second edge region E2 with more certainty.

Accordingly, in the first preferred embodiment, a low-acoustic-velocity region can be provided outside the central region C in the y direction with more certainty. Furthermore, a high-acoustic-velocity region is located outside the low-acoustic-velocity regions. This makes it possible to establish the piston mode with more certainty. It is therefore possible to reduce or prevent the transverse mode with more certainty.

Furthermore, the inventor of preferred embodiments of the present invention discovered that reduction or prevention of the transverse mode depends on a dielectric constant of the dielectric film 15A and the dielectric film 15B. Details of this will be described below.

The first preferred embodiment and a second comparative example were compared as to impedance frequency characteristics by simulation. In the first preferred embodiment, an $HfO_2$ film was used as the dielectric film. In the second comparative example, an elastic constant and a density of the dielectric film was set to an elastic constant and a density of an $HfO_2$ film, a dielectric constant of the dielectric film was set to a dielectric constant of an $SiO_2$ film. Design parameters of the acoustic wave device having the configuration of the first preferred embodiment and the acoustic wave device according to the second comparative example are similar to those in the case of comparison of behavior of the acoustic velocity except for the thickness of the dielectric film. The thickness of the dielectric film was set to about 30 nm.

Figure 5:
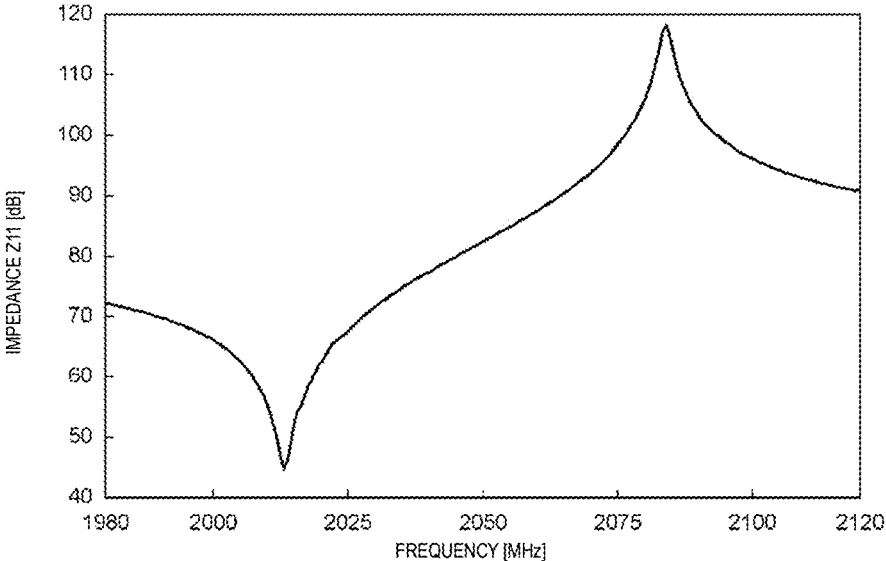
FIG. 5 illustrates impedance frequency characteristics in the first preferred embodiment of the present invention.
Figure 6:
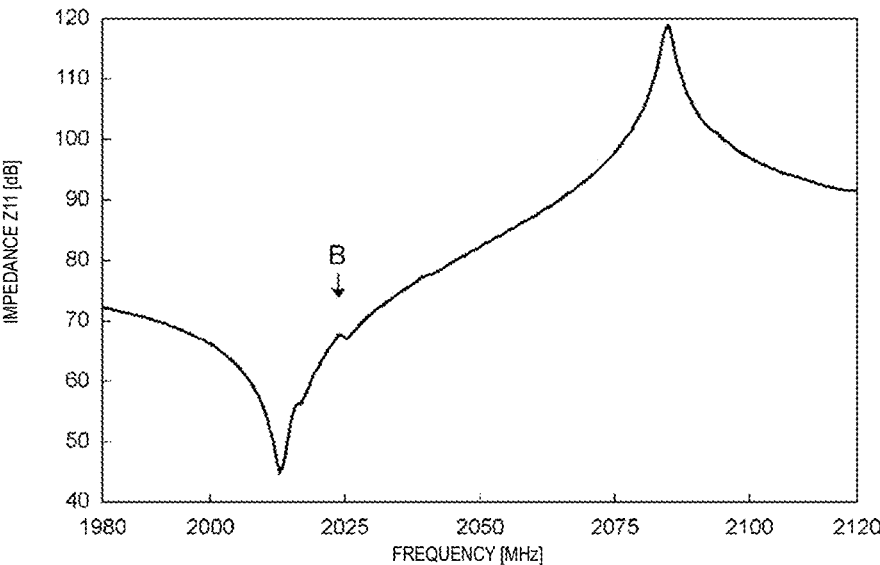
FIG. 6 illustrates impedance frequency characteristics in a second comparative example.

FIG. 5 illustrates impedance frequency characteristics in the first preferred embodiment. FIG. 6 illustrates impedance frequency characteristics in the second comparative example.

As illustrated in FIG. 5, in the first preferred embodiment, the transverse mode is reduced or prevented. On the other hand, in the second comparative example, a large transverse mode spurious occurs, as indicated by arrow B in FIG. 6. This shows that even in a case where the elastic constant and density of the dielectric film are the same or substantially the same as an elastic constant and a density of an $HfO_2$ film, it is difficult to suppress the transverse mode as long as the dielectric constant of the dielectric film is the same or substantially the same a dielectric constant of an $SiO_2$ film. As described above, it has been discovered that reduction or prevention of the transverse mode depends on a dielectric constant of the dielectric film.

A relationship between the acoustic velocity Vc and the acoustic velocity Ve was examined while changing the dielectric constant of the dielectric film and others in the acoustic wave device. In this way, a condition under which the acoustic velocity in the edge region can be lowered was derived. Details of this will be described below.

As described above, a wavelength defined by an electrode finger pitch of the IDT electrode is referred to as $\lambda$. The electrode finger pitch is a distance between centers of adjacent electrode fingers. Specifically, electrode finger pitch is a distance between center points of adjacent electrode fingers in the x direction. In a case where a distance between centers of electrode fingers is not constant, the electrode finger pitch is an average of distances between centers of electrode fingers. Furthermore, a thickness of the dielectric film is represented by t_D [$\lambda$], a dielectric constant of the dielectric film is represented by c, a density of the dielectric film is represented by d [kg/m³], a Young's modulus of the dielectric film is represented by Y [GPa], a thickness of the piezoelectric layer is represented by t_LT [$\lambda$], a thickness of the main electrode layer of the IDT electrode is represented by t_Al [$\lambda$], an acoustic velocity in the central region is represented by Vc, and an acoustic velocity in the pair of edge regions is Ve. Ve/Vc was calculated under each condition while changing the parameters. Design parameters of the acoustic wave device are as follows. Hereinafter, units of the parameters are sometimes omitted.

Support substrate; material . . . Si

High-acoustic-velocity film; material SiN, thickness . . . about 300 nm

Low-acoustic-velocity film; material SiO₂, thickness . . . about 300 nm

Piezoelectric layer; material . . . 55° Y-cut X-propagating LiTaO₃, thickness . . . t_LT Layer configuration of IDT electrode; layer configuration . . . Ti layer/Al layer/Ti layer from the piezoelectric layer side, thickness . . . about 12 nm/t_Al/about 4 nm from the piezoelectric layer side Wavelength of IDT electrode; about 2 μm Duty ratio of IDT electrode; about 0.5

Density d of dielectric film; changed in increments of about 2 kg/m³ within a range from about 2 kg/m³ to about 8 kg/m³

Young's modulus Y of dielectric film; changed in increments of about 70 GPa within a range from about 70 GPa to about 280 GPa Dielectric constant ε of dielectric film; changed in increments of about 5 within a range from about 5 to about 35

Thickness t_D of dielectric film; changed in increments of about 0.0025$\lambda$ within a range from about 0.0025$\lambda$ to about 0.0175$\lambda$ Thickness t_LT of piezoelectric layer; changed in increments of about 0.05$\lambda$ within a range from about 0.15$\lambda$ to about 0.3$\lambda$ Thickness t_Al of Al layer; changed in increments of about 0.0125$\lambda$ within a range from about 0.05$\lambda$ to about 0.075$\lambda$ Based on these, formula 1, which is a relational expression between the parameters and Ve/Vc, was derived.

$$Ve/Vc = 1.00431413354797 + (-0.00285716659280799) \times ((d[kg/m3]) - 4.66559485530547) + 0.0000854138472667538 \times ((Y[GPa]) - 163.239549839228) + (-0.000350625383356713) \times (\varepsilon - 20.050911039657) + 0.262088599487209 \times ((t\_D[\lambda]) - 0.00998794212218652) + (-0.00121829646867971) \times ((t\_LT[\lambda]) - 0.29981243301179) + (-0.0171813623903716) \times$$

$$((t\_Al[\lambda]) - 0.064995980707398) + 0.0000011344571772174 \times (((d[kg/m3]) - 4.66559485530547) \times ((Y[GPa]) - 163.239549839228)) + (-0.0000000938653776651) \times (((Y[GPa]) - 163.239549839228) \times ((Y[GPa]) - 163.239549839228) - 7625.27702101924) + 0.0000162006962167552 \times ((\varepsilon - 20.050911039657) \times (\varepsilon - 20.050911039657) - 125.050998634098) + (-0.286079428865232) \times (((d[kg/m3]) - 4.66559485530547) \times ((t\_D[\lambda]) - 0.00998794212218652)) + 0.00817326864820186 \times (((Y[GPa]) - 163.239549839228) \times ((t\_D[\lambda]) - 0.00998794212218652)) + (-0.0221047213078) \times ((\varepsilon - 20.050911039657) \times ((t\_D[\lambda]) - 0.00998794212218652)) + (-17.2441046243263) \times (((t\_D[\lambda]) - 0.00998794212218652) \times ((t\_D[\lambda]) - 0.00998794212218652) - 0.0000249563122710345) + 0.00438054956998946 \times (((d[kg/m3]) - 4.66559485530547) \times ((t\_LT[\lambda]) - 0.29981243301179)) + (-0.000147617022443897) \times (((Y[GPa]) - 163.239549839228) \times ((t\_LT[\lambda]) - 0, 29981243301179)) + (-0.23034817620302) \times (((t\_D[\lambda]) - 0.00998794212218652) \times ((t\_LT[\lambda]) - 0.29981243301179)) + (-0.0367578157483136) \times (((t\_LT[\lambda]) - 0.29981243301179) \times ((t\_LT[\lambda]) - 0.29981243301179) - 0.0199865671766099) + 0.0000409293299970899 \times (((Y[GPa]) - 163.239549839228) \times ((t\_Al[\lambda]) - 0.064995980707398)) + (-1.89603355496479) \times (((t\_D[\lambda]) - 0.00998794212218652) \times ((t\_Al[\lambda]) - 0.064995980707398)) + (-0.0528637488540428) \times (((t\_LT[\lambda]) - 0.29981243301179) \times ((t\_Al[\lambda]) - 0.064995980707398))$$  formula 1

It is only necessary that t_D [$\lambda$], ε, d [kg/m³], Y [GPa], t_LT [$\lambda$], and t_Al [$\lambda$] are values that make Ve/Vc derived by formula 1 less than 1. This makes it possible to provide the pair of edge regions as low-acoustic-velocity regions with more certainty. In this way, the piston mode can be established, and the transverse mode can be reduced or prevented.

In a case where the parameters are values that make Ve/Vc derived by formula 1 less than 1, the dielectric film 15A and the dielectric film 15B illustrated in FIG. 2 need not necessarily include hafnium oxide, niobium oxide, tungsten oxide, and cerium oxide. However, the dielectric film 15A and the dielectric film 15B preferably include at least one dielectric selected from the group consisting of hafnium oxide, niobium oxide, tungsten oxide, and cerium oxide.

As described above, in the piezoelectric substrate 2 according to the first preferred embodiment, the piezoelectric layer 6 is provided indirectly on the high-acoustic-velocity film 4 with the low-acoustic-velocity film 5 interposed therebetween. However, the configuration of the piezoelectric substrate 2 is not limited to this. First to third modifications of the first preferred embodiment that are different from the first preferred embodiment only in configuration of the piezoelectric substrate are described below. As in the first preferred embodiment, the transverse mode can be reduced or prevented with more certainty in the first to third modifications. In addition, energy of an acoustic wave can be effectively trapped on the piezoelectric layer 6 side.

Figure 7:
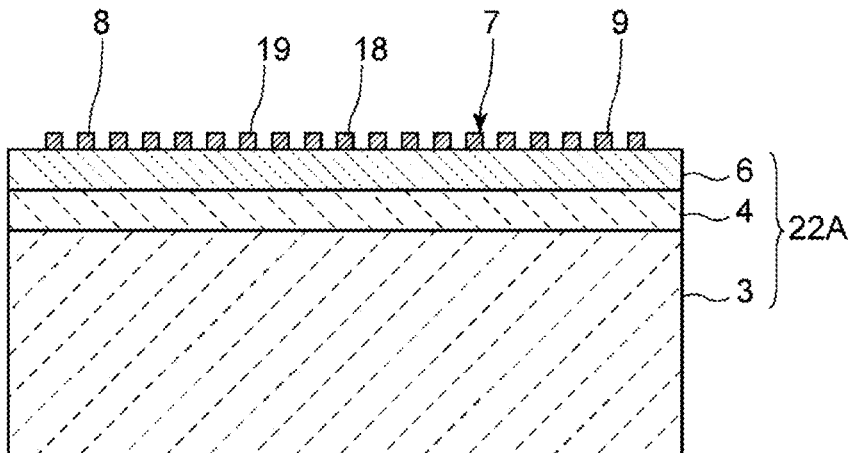
FIG. 7 is a front cross-sectional view of an acoustic wave device according to a first modification of the first preferred embodiment of the present invention.

In the first modification illustrated in FIG. 7, a piezoelectric substrate 22A includes the support substrate 3, the high-acoustic-velocity film 4, and the piezoelectric layer 6. In the present modification, the piezoelectric layer 6 is provided directly on the high-acoustic-velocity film 4 defining and functioning as the high-acoustic-velocity material layer.

Figure 8:
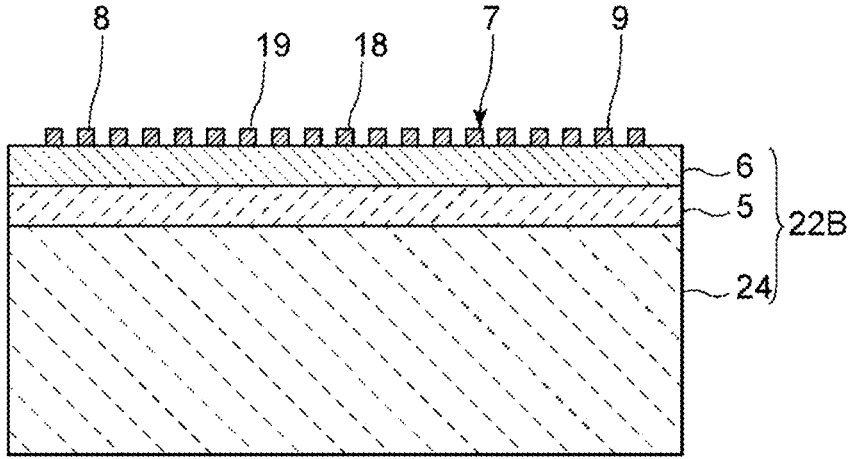
FIG. 8 is a front cross-sectional view of an acoustic wave device according to a second modification of the first preferred embodiment of the present invention.

In the second modification illustrated in FIG. 8, the high-acoustic-velocity material layer is a high-acoustic-velocity support substrate 24. A piezoelectric substrate 22B includes the high-acoustic-velocity support substrate 24, the low-acoustic-velocity film 5, and the piezoelectric layer 6. The low-acoustic-velocity film 5 is provided on the high-acoustic-velocity support substrate 24.

The high-acoustic-velocity support substrate 24 may be, for example, made of a medium including the above material as a main component, such as aluminum oxide, silicon carbide, silicon nitride, silicon oxynitride, silicon, sapphire, lithium tantalate, lithium niobate, quartz, alumina, zirconia, cordierite, mullite, steatite, forsterite, magnesia, DLC film, or diamond.

Figure 9:
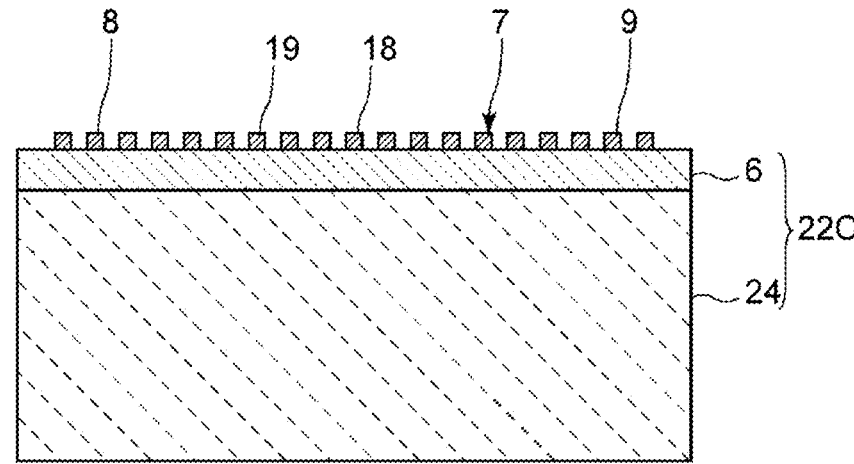
FIG. 9 is a front cross-sectional view of an acoustic wave device according to a third modification of the first preferred embodiment of the present invention.

In the third modification illustrated in FIG. 9, a piezoelectric substrate 22C includes the high-acoustic-velocity support substrate 24 and the piezoelectric layer 6. In the present modification, the piezoelectric layer 6 is provided directly on the high-acoustic-velocity support substrate 24 defining and functioning as the high-acoustic-velocity material layer.

Figure 10:
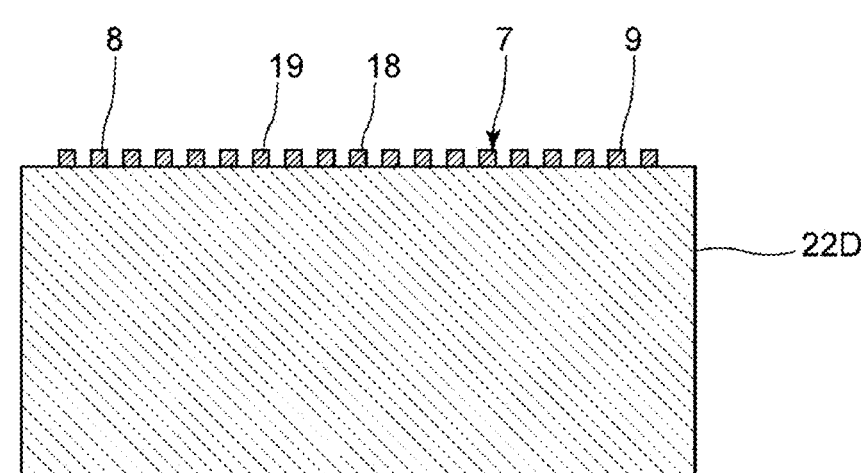
FIG. 10 is a front cross-sectional view of an acoustic wave device according to a fourth modification of the first preferred embodiment of the present invention.

Meanwhile, in a fourth modification of the first preferred embodiment illustrated in FIG. 10, a piezoelectric substrate 22D includes only a piezoelectric layer. The piezoelectric substrate 22D is a piezoelectric body substrate. Also in this case, the transverse mode can be reduced or prevented with more certainty, as in the first preferred embodiment.

Figure 11:
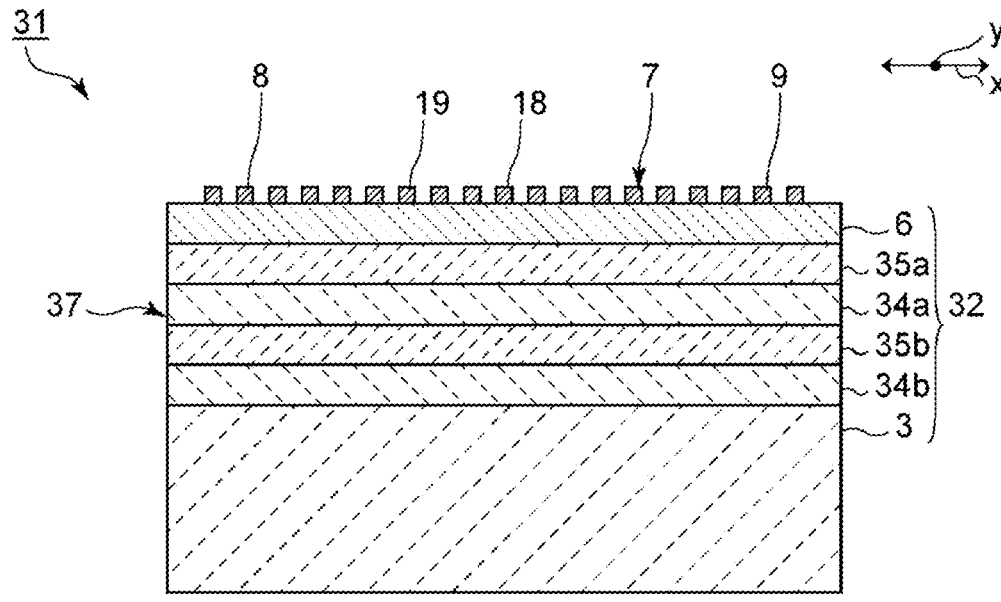
FIG. 11 is a front cross-sectional view of an acoustic wave device according to a second preferred embodiment of the present invention.

FIG. 11 is a front cross-sectional view of an acoustic wave device according to a second preferred embodiment of the present invention.

The present preferred embodiment is different from the first preferred embodiment in that a piezoelectric substrate 32 includes an acoustic reflecting film 37. More specifically, the piezoelectric substrate 32 includes a support substrate 3, the acoustic reflecting film 37, and a piezoelectric layer 6. The acoustic reflecting film 37 is provided on the support substrate 3. The piezoelectric layer 6 is provided on the acoustic reflecting film 37. Except for the above point, an acoustic wave device 31 according to the present preferred embodiment has a configuration the same as or similar to the acoustic wave device 1 according to the first preferred embodiment.

The acoustic reflecting film 37 is a multilayer body in which a plurality of acoustic impedance layers are laminated. More specifically, the acoustic reflecting film 37 includes a plurality of low-acoustic-impedance layers and a plurality of high-acoustic-impedance layers. The low-acoustic-impedance layers are layers of relatively low acoustic impedance. The plurality of low-acoustic-impedance layers of the acoustic reflecting film 37 are a low-acoustic-impedance layer 35a and a low-acoustic-impedance layer 35b. On the other hand, the high-acoustic-impedance layers are layers of relatively high acoustic impedance. The plurality of high-acoustic-impedance layers of the acoustic reflecting film 37 are a high-acoustic-impedance layer 34a and a high-acoustic-impedance layer 34b. The low-acoustic-impedance layer and the high-acoustic-impedance layer are alternately laminated. Note that the low-acoustic-impedance layer 35a is a layer located closest to the piezoelectric layer 6 among the layers of the acoustic reflecting film 37.

The acoustic reflecting film 37 includes, for example, two low-acoustic-impedance layers and two high-acoustic-impedance layers. However, it is only necessary that the acoustic reflecting film 37 includes at least one low-acoustic-impedance layer and at least one high-acoustic-impedance layer.

The low-acoustic-impedance layers may be, for example, made of a material such as silicon oxide or aluminum. The high-acoustic-impedance layers may be, for example, made of a metal such as platinum or tungsten or a dielectric such as aluminum nitride or silicon nitride.

Since the acoustic wave device 31 includes the acoustic reflecting film 37, energy of an acoustic wave can be effectively trapped on the piezoelectric layer 6 side.

An electrode structure on the piezoelectric substrate 32 in the present preferred embodiment is the same as or similar to that in the first preferred embodiment. Accordingly, an acoustic velocity can be made low in a pair of edge regions with more certainty, and the piston mode can be established with more certainty. It is therefore possible to reduce or prevent the transverse mode with more certainty.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
   a piezoelectric substrate; and
   an interdigital transducer (IDT) electrode on or above the piezoelectric substrate and including a plurality of electrode fingers; wherein
   a portion where adjacent electrode fingers of the plurality of electrode fingers of the IDT electrode overlap each other in an acoustic wave propagation direction is an intersecting region, and the intersecting region includes a central region located in a central portion in a direction in which the plurality of electrode fingers extend and a pair of edge regions on both sides of the central region in the direction in which the plurality of electrode fingers extend;
   the acoustic wave device further includes a dielectric film between the piezoelectric substrate and the plurality of electrode fingers in the pair of edge regions; and
   the dielectric film includes at least one of hafnium oxide, niobium oxide, tungsten oxide, or cerium oxide.

2. The acoustic wave device according to claim 1, wherein
   a pair of high-acoustic-velocity regions are provided outside the pair of edge regions in the direction in which the plurality of electrode fingers extend; and
   an acoustic velocity in the pair of high-acoustic-velocity regions is higher than an acoustic velocity in the central region.

3. The acoustic wave device according to claim 1, wherein the piezoelectric substrate includes only a piezoelectric layer.

4. The acoustic wave device according to claim 1, wherein
   the piezoelectric substrate includes a high-acoustic-velocity material layer and a piezoelectric layer directly or indirectly on the high-acoustic-velocity material layer; and
   an acoustic velocity of a bulk wave propagating through the high-acoustic-velocity material layer is higher than an acoustic velocity of an acoustic wave propagating through the piezoelectric layer.

5. The acoustic wave device according to claim 4, wherein
   the piezoelectric substrate includes a low-acoustic-velocity film between the high-acoustic-velocity material layer and the piezoelectric layer; and an acoustic velocity of a bulk wave propagating through the low-acoustic-velocity film is lower than an acoustic velocity of a bulk wave propagating through the piezoelectric layer.

6. The acoustic wave device according to claim 4, wherein the high-acoustic-velocity material layer is a high-acoustic-velocity support substrate.

7. The acoustic wave device according to claim 4, wherein the piezoelectric substrate includes a support substrate; and the high-acoustic-velocity material layer is a high-acoustic-velocity film on the support substrate.

8. The acoustic wave device according to claim 1, wherein the piezoelectric substrate includes an acoustic reflecting film and a piezoelectric layer on the acoustic reflecting film;

the acoustic reflecting film includes a high-acoustic-impedance layer having a relatively high acoustic impedance and a low-acoustic-impedance layer having a relatively low acoustic impedance; and the high-acoustic-impedance layer and the low-acoustic-impedance layer are alternately laminated.

9. The acoustic wave device according to claim 3, wherein the piezoelectric layer is a lithium tantalate layer.

10. An acoustic wave device comprising:

a piezoelectric substrate including a piezoelectric layer; and an interdigital transducer (IDT) electrode on or above the piezoelectric substrate and including a plurality of electrode fingers; wherein a portion where adjacent electrode fingers of the plurality of electrode fingers of the IDT electrode overlap each other in an acoustic wave propagation direction is an intersecting region, and the intersecting region includes a central region located at a central portion in a direction in which the plurality of electrode fingers extend and a pair of edge regions on both sides of the central region in the direction in which the plurality of electrode fingers extend;

the acoustic wave device further includes a dielectric film between the piezoelectric substrate and the plurality of electrode fingers in the pair of edge regions;

the piezoelectric layer is a lithium tantalate layer, the IDT electrode includes a main electrode layer, and the main electrode layer is an Al layer; and where λ [μm] is a wavelength defined by an electrode finger pitch of the IDT electrode, t_D [λ] is a thickness of the dielectric film, ε is a dielectric constant of the dielectric film, d [kg/m³] is a density of the dielectric film, Y [GPa] is a Young's modulus of the dielectric film, t_LT [λ] is a thickness of the piezoelectric layer, t_Al [λ] is a thickness of the main electrode layer of the IDT electrode, Vc is an acoustic velocity in the central region, and Ve is an acoustic velocity in the pair of edge regions, t_D [λ], ε, d [kg/m³], Y [GPa], t_LT [λ], and t_Al [λ] are values that make Ve/Vc derived by a following formula 1 less than 1:

$$Ve/Vc=1.00431413354797+(-$$
0.00285716659280799)×((d[kg/m3])–
4.66559485530547)+0.0000854138472667538×
((Y[GPa])–163.239549839228)+(–
0.000350625383356713)×(ε–
20.050911039657)+0.262088599487209×((t_D
[λ])–0,00998794212218652)+(–
000121829646867971)×((t_LT[λ])–
0.29981243301179)+(–0.0171813623903716)×
((t_Al[λ])–0.064995980707398)+
0.0000011344571772174×(((d[kg/m3])–

4.66559485530547)×((Y[GPa])–
163.239549839228))+(–
0.0000000938653776651)×(((Y[GPa])–
163.239549839228)×((Y[GPa])–
163.239549839228)–7625.27702101924)+
0.0000162006962167552×((ε–
20.050911039657)×(ε–20.050911039657)–
125.050998634098)+(–0.286079428865232)×
(((d[kg/m3])–4.66559485530547)×((t_D[λ])–
0.00998794212218652))+
0.00817326864820186x(((Y[GPa])–
163.239549839228)×((t_D[λ])–
0.00998794212218652))+(–0.0221047213078)×
((ε–20.050911039657)×((t_D[λ])–
0.00998794212218652))+(–
17.2441046243263)×((((t_D[λ])–
0.00998794212218652)×((t_D[λ])–
0.00998794212218652)–
0.0000249563122710345)+
0.00438054956998946×((((d[kg/m3])–
4.66559485530547)×((t_LT[λ])–
0.29981243301179))+(–
0.000147617022443897)×(((Y[GPa])–
163.239549839228)×((t_LT[λ])–0,
29981243301179))+(–0.23034817620302)×
((((t_D[λ])–0.00998794212218652)×((t_LT[λ])–
0.29981243301179))+(–0.0367578157483136)×
((((t_LT[λ])–0.29981243301179)×((t_LT[λ])–
0.29981243301179)–0.019865671766099)+
0.000409293299970899×(((Y[GPa])–
163.239549839228)×((t_Al[λ])–
0.064995980707398))+(–1.89603355496479)×
((((t_D[λ])–0.00998794212218652)×((t_Al[λ])–
0.064995980707398))+(–
0.0528637488540428)×((((t_LT[λ])–
0.29981243301179)×((t_Al[λ])–
0.064995980707398))                                formula 1.

11. The acoustic wave device according to claim 2, wherein a pair of high-acoustic-velocity regions are provided outside the pair of edge regions in the direction in which the plurality of electrode fingers extend; and an acoustic velocity in the pair of high-acoustic-velocity regions is higher than an acoustic velocity in the central region.

12. The acoustic wave device according to claim 10, wherein the piezoelectric substrate includes only a piezoelectric layer.

13. The acoustic wave device according to claim 10, wherein the piezoelectric substrate includes a high-acoustic-velocity material layer and a piezoelectric layer directly or indirectly on the high-acoustic-velocity material layer; and an acoustic velocity of a bulk wave propagating through the high-acoustic-velocity material layer is higher than an acoustic velocity of an acoustic wave propagating through the piezoelectric layer.

14. The acoustic wave device according to claim 13, wherein the piezoelectric substrate includes a low-acoustic-velocity film between the high-acoustic-velocity material layer and the piezoelectric layer; and an acoustic velocity of a bulk wave propagating through the low-acoustic-velocity film is lower than an acoustic velocity of a bulk wave propagating through the piezoelectric layer.

15. The acoustic wave device according to claim 13, wherein the high-acoustic-velocity material layer is a high-acoustic-velocity support substrate.

16. The acoustic wave device according to claim 13, wherein the piezoelectric substrate includes a support substrate; and the high-acoustic-velocity material layer is a high-acoustic-velocity film on the support substrate.

17. The acoustic wave device according to claim 10, wherein the piezoelectric substrate includes an acoustic reflecting film and a piezoelectric layer on the acoustic reflecting film;

the acoustic reflecting film includes a high-acoustic-impedance layer having a relatively high acoustic impedance and a low-acoustic-impedance layer having a relatively low acoustic impedance; and the high-acoustic-impedance layer and the low-acoustic-impedance layer are alternately laminated.

18. The acoustic wave device according to claim 12, wherein the piezoelectric layer is a lithium tantalate layer.

\* \* \* \* \*